US009299397B2

(12) United States Patent
Terçariol et al.

(10) Patent No.: US 9,299,397 B2
(45) Date of Patent: *Mar. 29, 2016

(54) REDUCING THE POWER CONSUMPTION OF MEMORY DEVICES UTILIZING DATA TRANSITION DETECTION

(71) Applicants: Walter L. Terçariol, Campinas (BR); Richard Titov Lara Saez, Campinas (BR); Afrânio Magno da Silva, Jr., Campinas (BR)

(72) Inventors: Walter L. Terçariol, Campinas (BR); Richard Titov Lara Saez, Campinas (BR); Afrânio Magno da Silva, Jr., Campinas (BR)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/485,754

(22) Filed: Sep. 14, 2014

(65) Prior Publication Data

US 2014/0376317 A1  Dec. 25, 2014

Related U.S. Application Data

(63) Continuation of application No. 13/709,103, filed on Dec. 10, 2012, now Pat. No. 8,902,677.

(51) Int. Cl.
*G11C 7/00* (2006.01)
*G11C 7/06* (2006.01)
*G11C 16/06* (2006.01)
*G11C 7/08* (2006.01)

(52) U.S. Cl.
CPC .. *G11C 7/00* (2013.01); *G11C 7/06* (2013.01); *G11C 7/065* (2013.01); *G11C 7/08* (2013.01); *G11C 16/06* (2013.01)

(58) Field of Classification Search
CPC .......... G11C 7/06; G11C 16/06; G11C 16/26; G11C 7/065; G11C 16/28; G11C 29/50; G11C 7/062; G11C 11/5642; G11C 2207/065; G11C 2207/002; G11C 7/14; G11C 2207/005; G11C 2207/063; G11C 29/026
See application file for complete search history.

(56) References Cited

U.S. PATENT DOCUMENTS

| | | | |
|---|---|---|---|
| 5,128,565 A | 7/1992 | McClintock | |
| 5,568,073 A * | 10/1996 | McClure | 327/51 |
| 6,122,203 A * | 9/2000 | Hunt et al. | 365/189.05 |
| 6,140,835 A * | 10/2000 | Shirai | 326/24 |
| 6,449,191 B1 | 9/2002 | Lin | |
| 7,843,737 B2 | 11/2010 | Theoduloz | |
| 2005/0030809 A1* | 2/2005 | Vimercati et al. | 365/222 |
| 2010/0008148 A1* | 1/2010 | Nguyen et al. | 365/185.21 |
| 2011/0019493 A1* | 1/2011 | Ikeda et al. | 365/203 |

* cited by examiner

*Primary Examiner* — Richard Elms
*Assistant Examiner* — Ajay Ojha
(74) *Attorney, Agent, or Firm* — Fogarty, L.L.C.

(57) ABSTRACT

Systems and methods for reducing the power consumption of memory devices. A method of operating a memory device may include monitoring a plurality of sense amplifiers, each sense amplifier configured to evaluate a logic value stored in a memory cell, determining whether each of the plurality of sense amplifiers has completed its evaluation, and stopping a reference current from being provided to the sense amplifiers in response to all of the sense amplifiers having completed their evaluations. An electronic circuit may include memory cells, sense amplifiers coupled to the memory cells, transition detection circuits coupled to the sense amplifiers, and control circuitry coupled to the transition detection circuits, the transition detection circuits configured to stop a reference current from being provided to the sense amplifiers if each transition detection circuit determines that its respective sense amplifier has identified a logic value stored in a respective memory cell.

20 Claims, 6 Drawing Sheets

REDUCING THE POWER CONSUMPTION OF MEMORY DEVICES UTILIZING DATA TRANSITION DETECTION

CROSS REFERENCE TO RELATED APPLICATIONS

The present application is a continuation of, and claims priority to, U.S. patent application Ser. No. 13/709,103 titled "REDUCING THE POWER CONSUMPTION OF MEMORY DEVICES" and filed on Dec. 10, 2012, the entirety of which is incorporated by reference herein.

FIELD

This disclosure relates generally to memory devices, and more specifically, to systems and methods for reducing the power consumption of memory devices.

BACKGROUND

Semiconductor memory devices are now used in a wide variety of electronic systems ranging from computers, to telecommunications hardware, to consumer appliances. Generally speaking, there are two types of semiconductor memory: volatile and non-volatile. Volatile memories require power in order to maintain stored information. Examples of volatile memory include Random Access Memory (RAM), Static RAM (SRAM), Dynamic RAM (DRAM), Double Data Rate RAM (DDR RAM), etc. Conversely, Non-Volatile Memories (NVMs) are capable of retaining stored information even when not powered. Examples of Non-Volatile Memory (NVM) include "flash" memory, Read-Only Memory (ROM), Erasable Programmable ROM (EPROM), Electrically Erasable Programmable ROM (EEPROM), etc.

To illustrate the operation of a modern semiconductor memory device, consider a flash memory. Flash memories store information in arrays of memory cells, which include floating-gate transistors. Each memory cell has a floating-gate transistor, and each transistor has two gates. The first gate serves as a control gate, and the second gate (called the "floating gate") is interposed between the control gate and the transistor's channel. The floating gate is electrically insulated from the rest of the transistor (hence the name "floating"), and thus capable of holding an electrical charge for long periods of time. When the floating gate holds such a charge, the electric field of the control gate becomes altered, which in turn modifies the threshold voltage of the transistor.

During a memory read operation, a voltage is applied to the control gate and the transistor's channel's conductivity is tested. The electric current through the transistor's channel is then sensed, for example, using a sense amplifier or the like. Specifically, the sense amplifier may compare a reference current with the memory cell's current. If the reference current is greater than the memory cell's current, the sense amplifier may determine that the memory cell is storing a first logic value (e.g., "1"). Conversely, if the reference current is smaller than the memory cell's current, the sense amplifier may determine that the memory cell is holding a second logic value (e.g., "0").

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity and have not necessarily been drawn to scale.

DETAILED DESCRIPTION

Embodiments disclosed herein are directed to systems and methods for reducing the power consumption of memory devices. In many implementations, these systems and methods may be incorporated into a wide range of electronic systems including, for example, computers or Information Technology (IT) products (e.g., servers, desktops, laptops, switches, routers, etc.), telecommunications hardware, consumer devices or appliances (e.g., mobile phones, tablets, televisions, cameras, sound systems, etc.), scientific instrumentation, industrial robotics, medical or laboratory electronics (e.g., imaging, diagnostic, or therapeutic equipment, etc.), transportation vehicles (e.g., automobiles, buses, trains, watercraft, aircraft, etc.), military equipment, etc. More generally, the systems and methods discussed herein may be incorporated into any device or system having one or more electronic parts or components.

Figure 1:
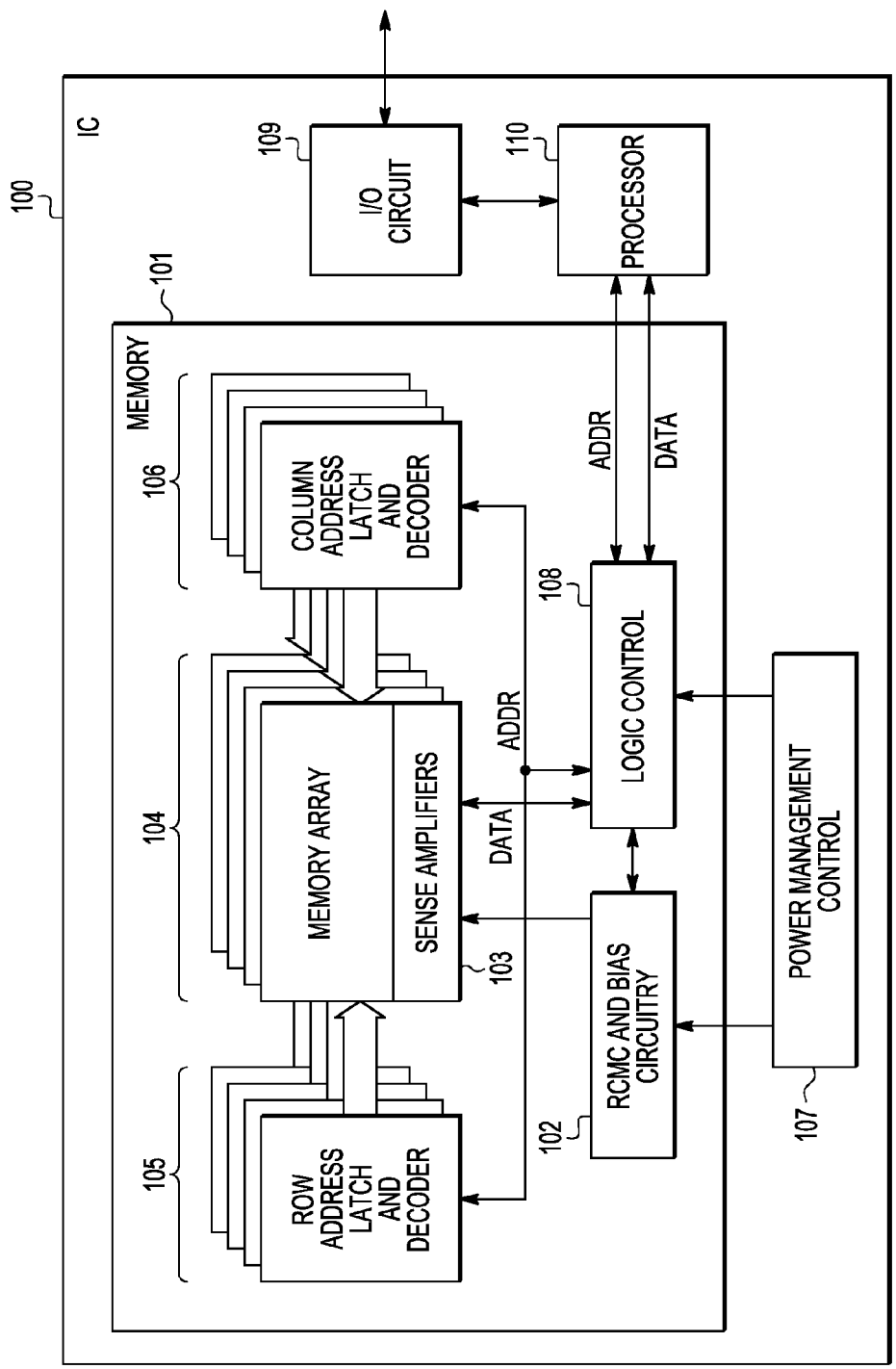
FIG. 1 is a block diagram of an integrated circuit (IC) according to some embodiments.

FIG. 1 is a block diagram of an example of integrated circuit (IC) 100 including memory circuitry 101. In some embodiments, IC 100 may be used in one or more of the aforementioned electronic devices (e.g., mounted onto a printed circuit board within the device). For example, IC 100 may be a System-On-Chip (SoC), an Application Specific Integrated Circuit (ASIC), a Digital Signal Processor (DSP), a Field-Programmable Gate Array (FPGA), a processor, a microprocessor, a controller, a microcontroller (MCU), or the like. Meanwhile, memory circuitry 101 may include a Random Access Memory (RAM), a Static RAM (SRAM), a Magnetoresistive RAM (MRAM), a Nonvolatile RAM (NVRAM, such as "FLASH" memory, etc.), a Dynamic RAM (DRAM) such as Synchronous DRAM (SDRAM), a Double Data Rate (e.g., DDR, DDR2, DDR3, etc.) RAM, an Erasable Programmable ROM (EPROM), an Electrically Erasable Programmable ROM (EEPROM), a nanocrystal-based memory, a magnetic storage device, an optical disc, a holographic memory, an organic memory, etc.

It should be noted, however, that FIG. 1 shows IC 100 for sake of illustration only. In different implementations, various systems and methods described herein may be deployed with any other suitable type of IC. Similarly, various systems and methods described herein may be deployed with any suitable type of memory.

As illustrated, input/output (I/O) circuitry 109 is operably coupled to processor circuitry 110. Processor circuitry 110 is operably coupled to logic control circuitry 108 within memory 101, which in turn is operably coupled to Reference Current Management Circuit (RCMC) & Bias Circuitry 102. Power management and control circuitry (PMC) 107 is operably coupled to RCMC & Bias Circuitry 102 and to logic control circuitry 108. Both RCMC & Bias Circuitry 102 and logic control circuitry 108 are operably coupled to sense amplifiers 103, and sense amplifiers 103 are operably coupled to memory array(s) 104. Logic control circuitry 108 is also coupled to row address latch and decoder circuit(s) 105 and/or to column address latch and decoder circuit(s) 106.

Memory array(s) 104 are operably coupled to row address latch & decoder circuit(s) 105 and to column address latch & decoder circuit(s) 106. Also, memory arrays 104 may include memory cells (also referred to as "bit cells"), each cell having a row and a column address associated therewith, and each configured to store data as a logic value.

In some embodiments, each logic value within each bit cell may be binary and represented as a "0" when a bit cell with increased threshold voltage $V_{th}$ is storing a change such that it generates a proportional current upon application of a read voltage of 1.2 Volts, "VDD," or any other suitable "read voltage." Alternatively, each logic value may be represented as a "1" when the bit cell with decreased $V_{th}$ is storing a charge such that it generates a proportional current upon application of the read voltage. In other embodiments, however, logic values may be other than binary and instead assume one of several multistate levels (e.g., 3 or more logic levels) at any given time.

In operation, I/O circuitry 109 may enable IC 100 to communicate with one or more external components, for example over a communications bus or the like. Processor circuitry 110 may include one or more processor cores, memories, etc. operable to perform one or more operations, execute one or more programs, etc. Logic control circuitry 108 of memory 101 may be configured to receive data and address information including, for example, a read or write command, data to be stored into memory (in the case of a write command), and/or the address(es) from where to read or write the data, from processor circuitry 110. Then, logic control circuitry 108 may interact with row address latch and decoder circuit(s) 105, column address latch and decoder circuit(s) 106, RCMC & Bias Circuitry 102, and/or sense amplifiers 103 to access the relevant one of memory arrays 104 in order to fulfill the read or write command. PMC circuitry 107 may manage the power provided to RCMC & Bias Circuitry 102 and/or logic control circuitry 108 within memory 101.

In connection with a read operation, for instance, logic control circuitry 108 may identify which one(s) of memory arrays 104 holds desired value(s). Then, the relevant one(s) row address latch & decoder circuit(s) 105, as well as the relevant one(s) of column address latch & decoder circuit(s) 106, may select the memory cell(s) of the selected memory array 104 at the identified memory addresses. For example, in some embodiments, row address latch & decoder circuit(s) 105 may convert a selected address received from processor circuitry 110 to one of its row address select lines for accessing a selected row of memory cells (e.g., a word line) via a corresponding bit line. Respective one(s) of sense amplifiers circuits 103 may then identify the logic value(s) stored in the relevant memory cell(s), and may provide those values back to logic control circuitry 108, which in turn pass those values to processor circuitry 110.

In some embodiments, each of memory arrays 104 may store information in an array of floating-gate transistors. In other words, each memory cell may have a floating-gate transistor, and each such transistor may have an electrically insulated floating gate that is capable of holding an electrical charge representing a logic value. When the floating gate holds such a charge, the threshold voltage of the transistor is modified. Accordingly, during a memory read operation, a voltage may be applied to the control gate and the electric current through the transistor may be sensed using one of sense amplifier circuit(s) 103. Specifically, sense amplifier circuit(s) 103 may compare a reference current with the current flowing through the transistor (referred to as "bit cell current").

In some embodiments, for example, if the reference current is greater than the bit cell current, sense amplifier circuit(s) 103 may determine that the memory cell is storing a first logic value (e.g., "1"). Conversely, if the reference current is smaller than the bit cell current, sense amplifier circuit(s) 103 may determine that the memory cell is holding a second logic value (e.g., "0"). In other embodiments, however, the "0" and "1" logic values may be switched.

Although memory 101 is illustrated with some level of detail, it should be noted that other types of memories may be used as previously described. In some cases, any type of memory that uses sense amplifier circuit(s) 103 may employ one or more of the systems and methods described herein.

Figure 2:
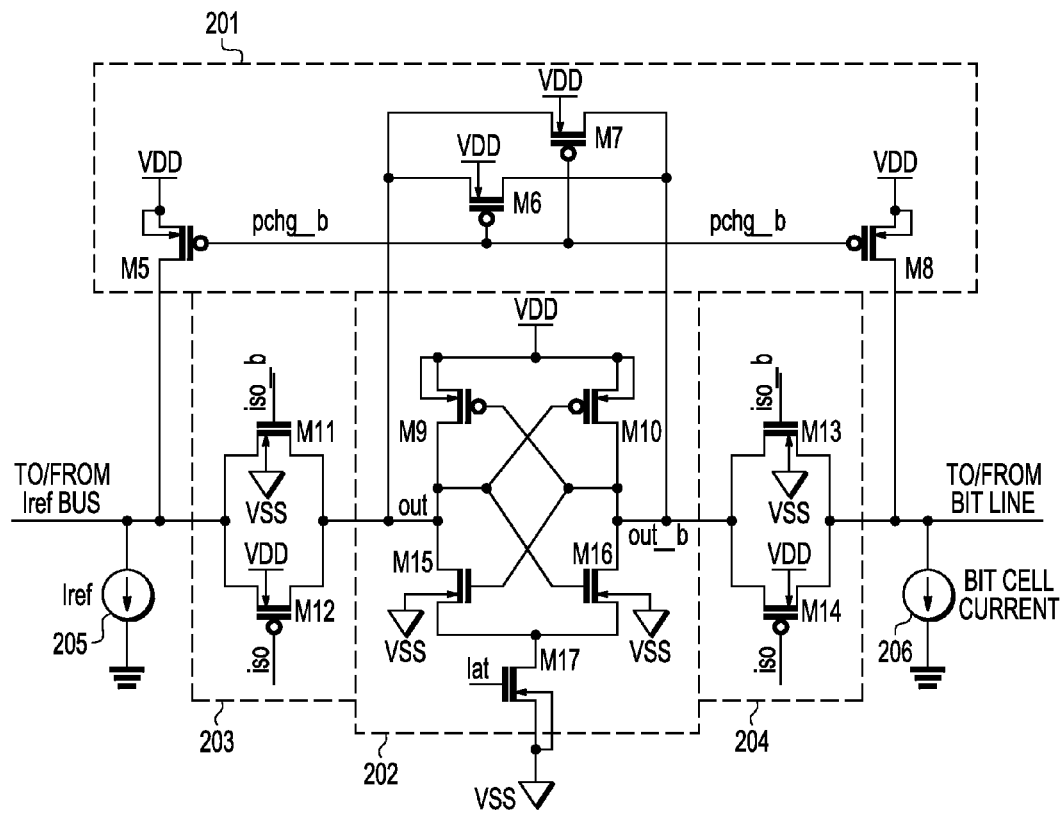
FIG. 2 is a circuit diagram of a Sense Amplifier (SA) according to some embodiments.

To better illustrate the foregoing, FIG. 2 shows a circuit diagram of an example of Sense Amplifier (SA) 200. In some embodiments, SA 200 may be employed within sense amplifier circuit(s) 103 shown in FIG. 1. Particularly, SA 200 may include pre-charge section 201 (including transistors M5, M6, M7, and M8), latch section 202 (including transistors M9, M10, M15, and M16), and switching sections 203 and 204 (including transistors M11, M12, M13, and M14). Precharge section 201, as well as switching sections 203 and 204, may be configured to prepare SA 200 to faciliate a memory read operation.

The read operation may include a comparison or evaluation performed by latch section 202 between reference current 205 (referred to as "Iref"), which may be provided by a current generator over a reference current bus, and bit cell current 206, which may be provided through the bit line of the memory cell being read within memory array 104. The comparison may be performed by latch section 202. Particularly, transistors M9, M10, M15, and M16 within latch section 202 create a positive feedback circuit with symmetric nodes "out" and "out_b." After a "precharge" phase where both "out" and "out_b" nodes are forcibly kept at VDD, those nodes are exposed to Iref 205 and bit cell current 206. Then, during a "latching" phase, the current with largest value pulls its respective node to 0 V and, consequently, the other node is pulled to VDD.

For example, if bit cell current 206 is greater than Iref 205, then the voltage at the "out" node goes to VDD and the voltage at the "out_b" node goes to 0 V. Conversely, if Iref 205 is greater than bit cell current 206, then the "out" node voltage goes to 0 V and the "out_b" node voltage goes to VDD.

To enable these operations, a current generator (e.g., shown later as element 303 in FIG. 3) may provide Iref 205 to sense amplifier 200. In some embodiments, a current generator may be included, for example, within RCMC & Bias Circuitry 102 of FIG. 1. It should be noted, however, that Iref 205 does not need to be provided to SA 200 the entire time (e.g., when a memory read or operation is not being performed). In some cases, an enabling signal ("EN_REF") may be used to turn on and off Iref 205 at the appropriate times, thus implementing a power consumption reduction technique as described in more detail below.

To recapitulate, in order to read the information stored in a given memory cell, various different types of memory devices may use sense amplifiers 103 (such as SAs 200) to compare Iref 205 with bit cell current 206. In some scenarios, a single reference current generator may provide Iref 205 to two or more sense amplifiers (e.g., two or more SAs 200) over an Iref bus. However, due to variations in semiconductor manufacturing processes, memory use or aging patterns, etc., not all SAs are capable of evaluating Iref 205 against bit cell current 206 simultaneously. Thus, to avoid read errors, the reference current generator may provide Iref 205 to sense amplifiers 103 for fixed time (e.g., a Sense Amplifier Time Out, or SATO) that is longer than necessary, thus undesirably increasing the power consumption of the memory device.

Accordingly, in some embodiments, the systems and methods described herein may reduce the power consumption of memory devices, for example, by stopping the reference current from being provided to the sense amplifiers in response to a determination that all of the sense amplifiers have identified the logic value of their respective bit cells. Conversely, in response to fewer than all sense amplifiers having identified the logic value of their respective bit cells, the reference current may continue to be provided.

It should be noted that these systems and methods are independent of the actual data value stored in a given bit cell, which may be determined by another circuit in the data path (e.g., within logic control circuitry 108 in FIG. 1). For example, in order to read the value stored in a bit cell, logic control circuitry 108 may be coupled to one of SA 200's "out" or "out_b" nodes. In contrast, to determine whether SAs 200 have finished their respective evaluations, in some implementations RCMC & Bias Circuitry 102 may be coupled to both "out" and "out_b" nodes of each SA.

Figure 3:
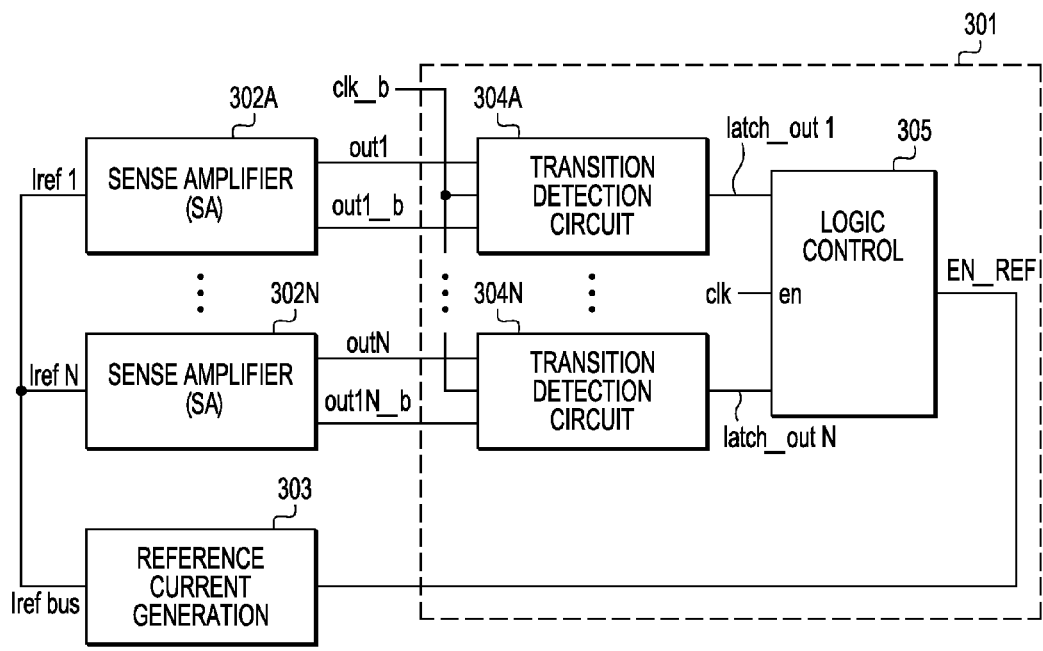
FIG. 3 is a block diagram of a Reference Current Management Circuit (RCMC) configured to reduce the power consumption of a memory device according to some embodiments.

Turning now to FIG. 3, a block diagram of an example of RCMC 301 configured to reduce the power consumption of a memory device is depicted. In some embodiments, RCMC 301 may be implemented as the RCMC portion of RCMC & Bias Circuitry 102 in FIG. 1. As illustrated, reference current generation circuitry 303 may be configured to provide a reference current ("Iref") to a plurality of sense amplifiers 302A-N (e.g., similar to SA 200 of FIG. 2 and located within sense amplifier circuits 103 in FIG. 1). Moreover, RCMC 301 may provide an EN_REF signal to control reference current generation circuitry 303 in response to the outputs of SAs 302A-N (i.e., "out1" and "out1_b" through "outN" and "outN_b," respectively). Particularly, RCMC 301 may include one or more Transition Detection Circuits (TDCs) 304A-N operably coupled to respective ones of sense amplifiers 302A-N. RCMC 301 may also include logic control circuitry 305 operably coupled to the outputs of each TDC 304A-N ("latch_out1" through "latch outN"). Logic control circuitry 305 may be configured to receive a system clock signal ("clk") at an "enable" pin, and each of TDCs 304A-N may be configured to receive an inverted clock signal ("clk_b") at a "reset" pin.

Figure 4:
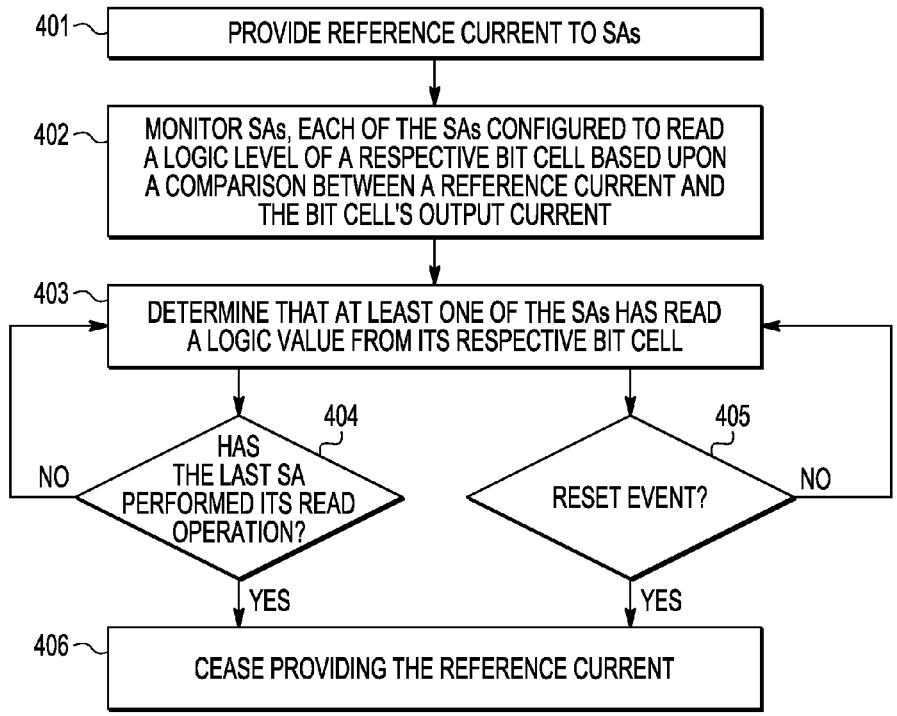
FIG. 4 is a flowchart of a method of reducing the power consumption of a memory device according to some embodiments.
Figure 5:
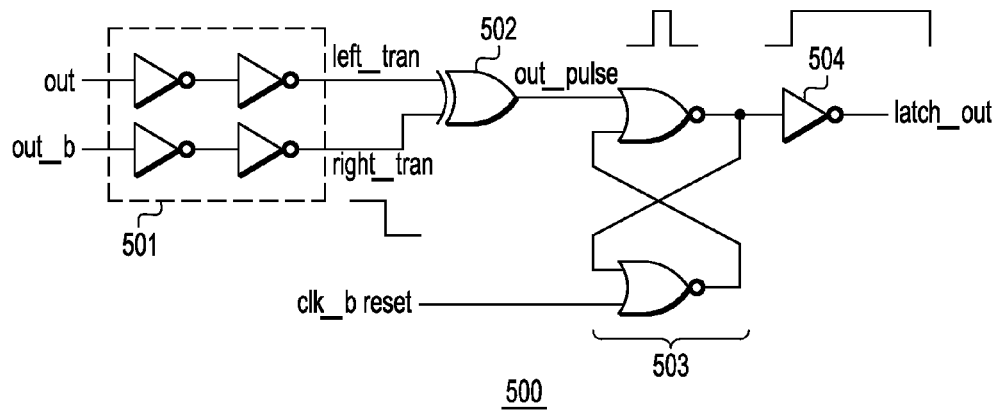
FIG. 5 is circuit diagram of a Transition Detection Circuit (TDC) of an RCMC according to some embodiments.
Figure 7:
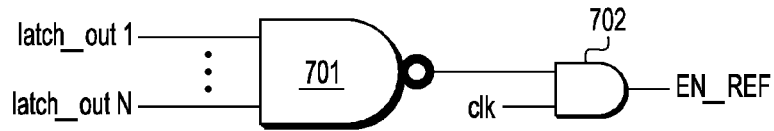
FIG. 7 is a circuit diagram of a logic control circuit of an RCMC according to some embodiments.

The operation of RCMC 301 is described in connection with FIG. 4, and examples of circuits configured to implement TDCs 304A-N and logic control circuitry 305 are shown in FIGS. 5 and 7, respectively. In some embodiments, the modules or blocks shown in FIG. 3 may represent processing circuitry and/or sets of software routines, logic functions, circuitry, and/or data structures that, when executed by the processing circuitry, perform specified operations. Although these modules are shown as distinct logical blocks, in other embodiments at least some of the operations performed by these modules may be combined in to fewer blocks. Conversely, any given one of these modules may be implemented such that its operations are divided among two or more logical blocks. Although shown with a particular configuration, in other embodiments these various modules or blocks may be rearranged in other suitable ways.

FIG. 4 is a flowchart of an example of method 400 of reducing the power of a memory device. In some embodiments, method 400 may be performed, at least in part, by RCMC 301 of FIG. 3. At block 401, method 400 may include providing a reference current (e.g., Iref 205 in FIG. 2) to a plurality of sense amplifiers (e.g., 302A-N of FIG. 3). For example, such a reference current may be provided by reference current generation circuitry 303 of FIG. 3 in connection with a memory read operation. At block 402, method 400 may include monitoring the plurality of sense amplifiers, each of the plurality of sense amplifiers configured to identify a logic value stored in a respective one of a plurality of bit cells (e.g., within memory array 104 of FIG. 1) based upon a comparison between a reference current (e.g., Iref 205 in FIG. 2) and the respective bit cell's output current (e.g., current 206, also shown in FIG. 2). For example, block 402 may be performed, at least in part, by each of TDCs 304A-N.

At block 403, method 400 may include determining that at least one of the sense amplifiers (e.g., 302A-N) has read a logic value from its respective bit cell. Rather than taking action at this point, however, method 400 may continue in blocks 404 and/or 405 to determine whether the last sense amplifier has performed its memory read operation and/or whether a reset event (e.g., indicated by clock signal "clk" or its inverse "clk_b") has taken place, respectively. If there is no reset event and/or if the last sense amplifier has not yet made its memory read out determination, then control returns to block 403. Otherwise, control passes to block 406 and method 400 may include ceasing to provide the reference current to the sense amplifiers (e.g., by controlling the EN_REF signal otherwise provided to reference current generation circuit 303 of FIG. 3). In short, method 400 may cause the reference current cease to be provided to the plurality of sense amplifiers in response to a determination that all of those sense amplifiers have identified the logic value of their respective bit cells.

It should be understood that the various operations described herein, particularly in connection with FIG. 4, may be implemented in software executed by processing circuitry, hardware, or a combination thereof. The order in which each operation of a given method is performed may be changed, and various elements of the systems illustrated herein may be added, reordered, combined, omitted, modified, etc. It is intended that the invention(s) described herein embrace all such modifications and changes and, accordingly, the above description should be regarded in an illustrative rather than a restrictive sense.

FIG. 5 is circuit diagram of an example of TDC 500. In some embodiments, TDC 500 may be one of TDCs 304A-N of FIG. 3. As illustrated, each input into TDC 500 (e.g., "out" and "out_b") may be an output of a sense amplifier (e.g., SA 200 of FIG. 2). Both of TDC 500's inputs may be processed by buffer 501, which may include two or more inverters, for example. Once buffered, each input may be fed into exclusive OR ("XOR") gate 502. At some point during a read operation, these inputs may become different from each other (e.g., "out" stays at a logic "1" and "out_b" swings from "1" to "0"), and thus the output of XOR gate 502 also changes from a logic "0" to a logic "1." However, once the sense amplifier has made this detection, both of its outputs may return to "0." Accordingly, the output of XOR gate may also return to "0," thus resulting in a pulse signal ("out_pulse") reflecting the time when the sense amplifier was able to distinguish the logic value stored in a bit cell. Further, at the time of the pulse, latch circuit or flip-flop 503 may output a logic "0," which may then be inverted by inverted 504 into a logic "1" to create a "latch_out" signal (i.e., absent application of "clk_b" signal at the reset pin of latch circuit 503).

Figure 6:
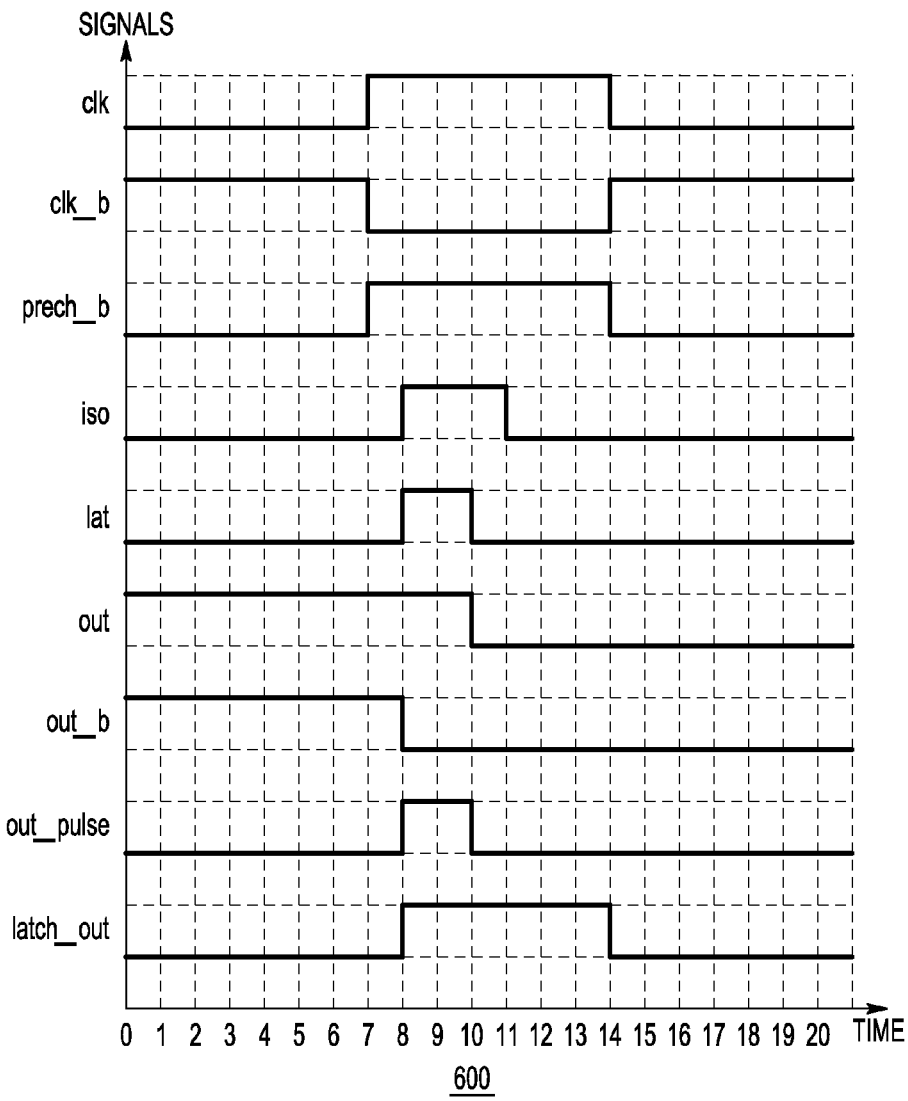
FIG. 6 is a chart showing signals processed by a TDC during a memory read operation according to some embodiments.

To further explain these operations, FIG. 6 is a chart showing an example of signals processed by TDC 500 during a memory read out. In some embodiments, the signals shown are the same as illustrated in FIGS. 2 and 5. Particularly, "clk" signal may be a clock used by the relevant circuitry, and "clk_b" may be its inverse. "Prech_b" is a precharge signal, asserted simultaneously with clock signal "clk" at time equal to 7 time units. "Iso" and "Iat," also shown in FIG. 2, illustrate the instant in time (in this example, when time is equal to 8 time units) when a sense amplifier can assess a logic value within a bit cell (e.g., by comparing Iref 205 with bit cell current 206). Assume, in this example, that the logic value within the bit cell being read is "1" (e.g., the floating gate of the bit cell's transistor is storing a low amount of electrical charges and/or low $V_{th}$). In this case, the output voltage at the "out" node is greater than the output voltage at the "out_b" node at least while "Iat" is equal to "1" (i.e., between time units 8 and 10) and XOR gate 502 outputs an "out_pulse" signal starting at the same time (i.e., when the time is equal to 8 time units). Accordingly, "latch_out" may switch from a logic "0" to a logic "1" simultaneously with the rising edge of the "out_pulse" signal (i.e., at the time equal to 8 time units), later returning to "0" when the "clk_b" input into the reset pin of latch circuit 503 goes to "1" (i.e., at a time equal to 14 time units).

As previously noted, each TDC 500 may provide its "latch_out" output signal to a logic control circuit or the like. This is shown in FIG. 7, where a circuit diagram of an example of logic control circuit 700 is depicted. In some embodiments, logic control circuit 700 may be used as block 305 of FIG. 3. As illustrated, a plurality of "latch_out" signals, each provided by one of a plurality of TDC circuits (e.g., TDCs 304A-N of FIG. 3) which in turn are each operably coupled to one of a plurality of sense amplifiers, may be input into NAND gate 701. The output of NAND gate 701 may then be input into AND gate 702 along with a "clk" signal. As such, the output of AND gate 702 may be used as an "EN_REF" signal that may in turn be provided to reference current generation circuitry 303 of FIG. 3.

In operation, the output of NAND gate 701 remains at "1" so long as fewer than all "latch_out" signals are at a logic "1," thus indicating that fewer than all sense amplifiers have completed their respective memory readout operations, as identified by corresponding TDCs. During this time, the inputs to AND gate 702 are both "1" (so long as "clk" is also "1"), the EN_REF signal is asserted, and therefore reference current generator circuitry 303 of FIG. 3 continues to provide "Iref" to each of sense amplifiers 302A-N. When all of the "latch_out" signals are at the logic "1" (that is, when all sense amplifiers have performed their respective memory readout operations, as identified by corresponding TDCs), however, the output of NAND gate 701 switches to "0" and EN_REF also goes to "0," even if the "clk" signal is still at "1." Thus, the EN_REF signal is de-asserted, and reference current generator circuitry 303 stops providing "Iref" to sense amplifiers 302A-N.

In other words, logic control circuit 700 asserts EN_REF in response to all of the "latch_out" signals indicating that a bit cell has been read by a respective sense amplifier, and stops asserting the EN_REF signal immediately or approximately immediately upon a determination that all sense amplifiers have completed their memory read-out operations. It should be noted that the logic value of each "latch_out" signal depends upon whether a respective sense amplifier has made its evaluation, but the signal is independent of the result of such that evaluation; that is, the "latch_out" signal does not depend upon which value is actually stored in a given memory cell (a "0" or a "1").

Figure 8:
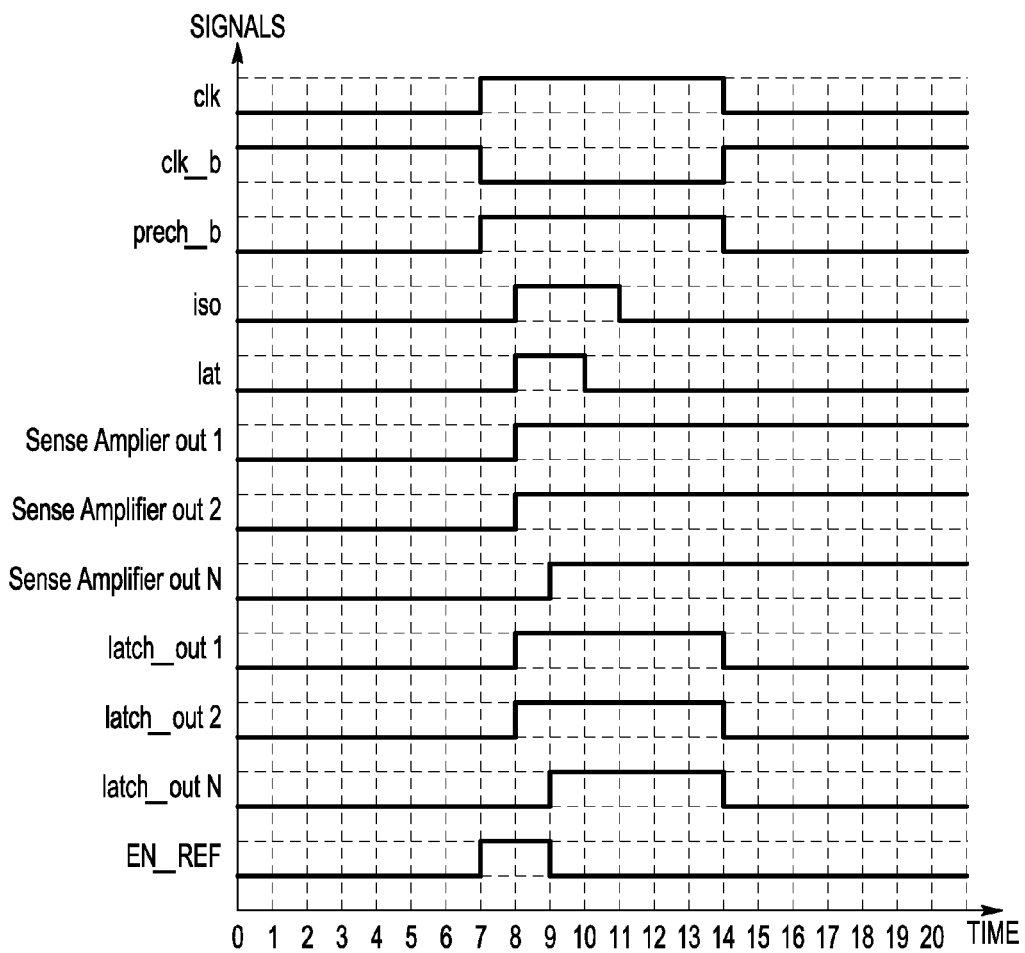
FIG. 8 is a chart showing signals processed by a control circuit during a memory read operation according to some embodiments.

To further illustrate the foregoing, FIG. 8 is a chart showing an example of signals processed by control circuit 700 during a memory read operation. As illustrated, signals "clk," "clk_b," "prech_b," "iso," and "lat" are the same as shown in FIG. 6. In this example, however, it is shown that two of three sense amplifiers ("out 1" and "out 2") complete their sensing operations at a time equal to 8 time units, but the third sense amplifier ("out N") only completes its sensing operation at a time equal to 9 time units. Each "latch_out" signal that follows is fed into NAND gate 701 of FIG. 7. Accordingly, the EN_REF signal is asserted along with "clk" (at the time equal to 7 time units) to enable each sense amplifier to receive a reference current. EN_REF also stays asserted as long as at least one of the three sense amplifiers (i.e., between 7 and 9 time units), and it ceases to be asserted when all sense amplifiers (and thus all "latch_out" signals) indicate that the logic value of a respective bit cell has been determined (i.e., at the time equal to 9 time units).

In some situations, a Sense Amplifier Time Out (SATO) technique may be employed such that the EN_REF signal, rather than being controlled by RCMC 301 of FIG. 3, is controlled by a time out circuit. Using such a technique, a "delta T" may be used to de-assert EN_REF after a fixed amount of time without regard to the status of each sense amplifier. For example, with reference to the diagram of FIG. 8, a "delta T" may be set at a time equal to 13 time units (i.e., less than the "clk" period) to attempt to reduce power consumption. More generally, such a "delta T" value may be used to reduce the amount of time during which the reference current is provided to the sense amplifiers, but while maintaining that reference current for a minimum amount of time sufficient to allow all sense amplifiers to perform their evaluation operations. The inventors hereof have discovered, however, that at least in part due to circuit aging effects (e.g., aging of sense amplifiers, bit cells, etc.) and the like, it would not be feasible to find a suitable "delta T" for the various possible memory circuit configurations throughout a memory circuit's useful life. By employing the systems and methods described herein, the EN_REF signal may be controlled in response to all sense amplifiers having verifiably completed their evaluation operations. In some embodiments, a time out technique may complement the EN_REF technique such that the reference current is cut off a "delta T" after assertion of the "EN_REF" signal.

Figure 9:
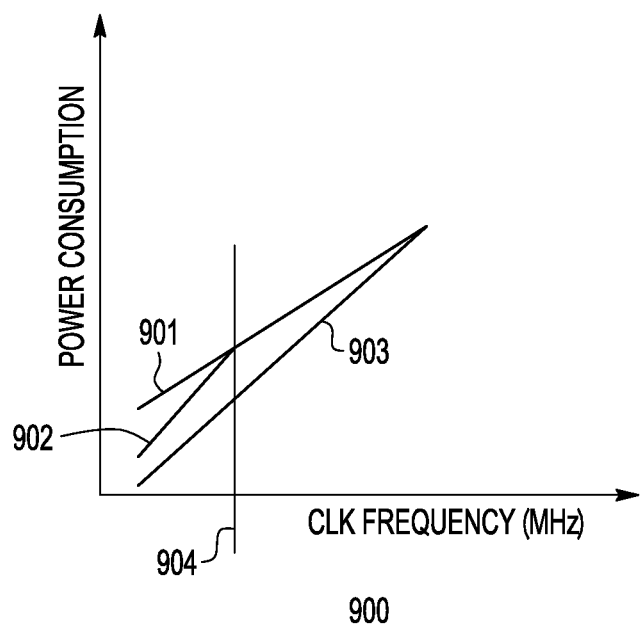
FIG. 9 is a graph illustrating various power consumption reduction results achievable using different techniques.

FIG. 9 is a graph illustrating various power consumption reduction results achievable using different techniques. Particularly, the vertical axis shows power consumption and the vertical axis shows the frequency of the "clk" signal. Curve 901 represents the power consumption of a memory circuit without implementing any of the foregoing power savings techniques—that is, a reference current is provided to all sense amplifiers so long as the "clk" signal is at a logic "1." Meanwhile, curve 902 represents the power consumption of the memory circuit when implementing a SATO technique, such that the reference current is provided to all sense amplifiers for a fixed "delta T" that is shorter than the period of time during which the "clk" signal is at the logic "1." It should be noted that vertical line 904 represents the SATO frequency timeout, which takes place when the frequency of the "clk" signal equals the SATO frequency. After that point, there is no discernible difference in power consumption reduction between using a SATO technique or not. In contrast, curve 903 represents the power consumption of the memory circuit when implementing the various systems and methods described herein. Notably, the power consumption of curve 903 is less than the power consumption using SATO techniques across all clock frequencies, or at least up to the maximum system frequency.

In an illustrative, non-limiting embodiment, a method may include monitoring a plurality of sense amplifiers, each of the plurality of sense amplifiers configured to evaluate a logic value stored in a respective memory cell based upon a comparison between a reference current and the respective memory cell's output current. The method may also include determining whether each of the plurality of sense amplifiers has completed its evaluation based upon the monitoring, and stopping the reference current from being provided to the plurality of sense amplifiers in response to all of the plurality of sense amplifiers having completed their evaluations. For example, the control circuitry may be configured to provide the reference current to the plurality of sense amplifiers in response to fewer than all of the plurality of transition detection circuits having made the determination.

In some implementations, monitoring the plurality of sense amplifiers may include monitoring, for each of the plurality of sense amplifiers, a first node and a second node. For example, the first node may be configured to receive the reference current and the second node is configured to receive the respective memory cell's output current. Also, the monitoring may include, for each of the plurality of sense amplifiers, comparing a voltage at the first node against another voltage at the second node.

The method may include, for a given one the plurality of sense amplifiers, generating an indication that the given sense amplifier has evaluated the logic value stored in its respective memory cell. The method may also include, for another one of the plurality of sense amplifiers, foregoing generation of another indication that the other sense amplifier has evaluated the logic value stored in its respective memory cell. As such, the method may include providing the reference current to the plurality of sense amplifiers in the absence of the other indication. The method may further include, for the other one the plurality of sense amplifiers, generating the other indication that the other sense amplifier has evaluated the logic value stored in its respective memory cell. Then, the method may include stopping the reference current from being provided to the plurality of sense amplifiers after the generation of the other indication.

Alternatively, the method may include, for another one the plurality of sense amplifiers, generating another indication that the other amplifier has evaluated the logic value stored in its respective memory cell. The method may then include stopping the reference current from being provided to the plurality of sense amplifiers after the generation of the other indication.

In another illustrative, non-limiting embodiment, an electronic circuit may include a plurality of memory cells, a plurality of sense amplifiers, each of the plurality of sense amplifiers operably coupled to one or more of the plurality of memory cells, and a plurality of transition detection circuits, each transition detection circuit operably coupled to a respective one of the plurality of sense amplifiers. The electronic circuit may also include control circuitry operably coupled to the plurality of transition detection circuits and configured to stop a reference current from being provided to the plurality of sense amplifiers in response to each of the plurality of transition detection circuits having made a determination that its respective one of the plurality of sense amplifiers has identified a logic value stored in one of the plurality of memory cells.

Additionally or alternatively, the control circuitry may be further configured to provide the reference current to the plurality of sense amplifiers in response to fewer than all of the plurality of transition detection circuits having made the determination.

In some implementations, each of the plurality of transition detection circuits may be configured to monitor, for its respective sense amplifier, a first output of a first node and a second output of a second node.

Also, each of the plurality of transition detection circuits may include a first logic circuit configured to output a predetermined value in response to the first and second outputs having different logic values. The first logic circuit may in turn include: (a) logic circuitry configured to implement an exclusive OR (XOR) operation, the logic circuitry having its inputs operably coupled to the first and second nodes of the respective sense amplifier, and (b) a flip-flop having one of its inputs operably coupled to an output of the logic circuitry and another of its inputs configured to receive a reset signal. In some cases, a buffer circuit may be operably coupled to the first and second nodes of the respective sense amplifier and to inputs of the logic circuitry.

Additionally or alternatively, the control circuitry may include a second logic circuit configured to output a control signal in response to all of the plurality of transition detection circuits outputting the predetermined value. The second logic circuitry may include (a) first logic circuitry configured to implement a NAND operation, the first logic circuitry having its inputs operably coupled to the outputs of the first logic circuit, and (b) second logic circuitry configured to implement an AND operation, the second logic circuitry having: one of its inputs operably coupled to an output of the first logic circuitry, another of its inputs configured to receive a clock signal, and its output configured to provide a reference current enabling signal.

In some embodiments the electronic circuit may further include a reference current generation circuit operably coupled to the control circuitry and to the plurality of sense amplifiers, the reference current generation circuit configured to output the reference current to each of the plurality of sense amplifiers in the absence of an indication from the control circuitry.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, thee terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. A method of operating a memory, the method comprising:
    evaluating, by a sense amplifier, a logic value stored in a memory cell based upon a comparison between a reference current and the memory cell's output current;
    generating an indication, by a detection circuit, that the sense amplifier has completed its evaluation; and
    using the indication, by a control circuit, to determine when to stop the reference current from being provided to the sense amplifier.

2. The method of claim 1, wherein generating the indication includes monitoring a first node and a second node of the sense amplifier.

3. The method of claim 2, wherein the first node is configured to receive the reference current and the second node is configured to receive a memory cell's output current.

4. The method of claim 3, the monitoring further comprising comparing a voltage at the first node against another voltage at the second node.

5. The method of claim 1, further comprising stopping the reference current from being provided after a predetermined amount of time following a determination that the sense amplifier has completed its evaluation.

6. The method of claim 1, further comprising:
    evaluating, by a second sense amplifier, a second logic value stored in a second memory cell based upon a comparison between a reference current and the second memory cell's output current; and
    generating a second indication, by the detection circuit, that the second sense amplifier has completed its evaluation.

7. The method of claim 6, wherein the using by the control circuit further includes allowing the reference current to continue to be provided to the sense amplifier if both the first indication and the second indication have not been generated.

8. An electronic circuit, comprising:
    a memory cell;
    a sense amplifier operably coupleable to the at least one memory cell to identify logic values stored in the at least one memory cell during a read operation, the sense amplifier including an input configured to receive a reference current used to identify a logic value during a read operation;
    a transition detection circuit operably coupled to the sense amplifier and having an output configured to provide an indication that the sense amplifier has identified a logic value stored in a memory cell of the at least one memory cell during a read operation; and
    a control circuit operably coupled to the transition detection circuit and configured to use the indication from the transition detection circuit in determining when to stop the reference current from being provided to the sense amplifier after a read operation.

9. The electronic circuit of claim 8, the control circuit further configured to provide the reference current to the sense amplifier when the transition detection circuit has not provided the indication that the sense amplifier has identified the logic value during the read operation.

10. The electronic circuit of claim 8, the transition detection circuit configured to monitor a first output at a first node of the sense amplifier and a second output at a second node of the sense amplifier.

11. The electronic circuit of claim 10, the transition detection circuit further comprising a first logic circuit configured to output a predetermined value in response to the first and second outputs having different logic values.

12. The electronic circuit of claim 11, the first logic circuit comprising logic circuitry configured to implement an exclusive OR (XOR) operation, the logic circuitry having its inputs operably coupled to the first and second nodes.

13. The electronic circuit of claim 12, the first logic circuit further comprising a flip-flop having one of its inputs operably coupled to an output of the logic circuitry and another of its inputs configured to receive a reset signal.

14. The electronic circuit of claim 13, further comprising a buffer circuit operably coupled to the first and second nodes and to inputs of the logic circuitry.

15. The electronic circuit of claim 11, the control circuit further comprising a second logic circuit configured to output a control signal in response to the first logic circuit outputting the predetermined value.

16. The electronic circuit of claim 15, the second logic circuit comprising first logic circuitry configured to implement a NAND operation, the first logic circuitry having its inputs operably coupled to the output of the first logic circuit.

17. The electronic circuit of claim 16, the second logic circuit further comprising second logic circuitry configured to implement an AND operation, the second logic circuitry having: one of its inputs operably coupled to an output of the first logic circuitry, another of its inputs configured to receive a clock signal, and its output configured to provide a reference current enabling signal.

18. The electronic circuit of claim 8, further comprising a reference current generation circuit operably coupled to the control circuit and to the sense amplifier, the reference current generation circuit configured to output the reference current to the sense amplifier in the absence of the indication from the transition detection circuit.

19. The electronic circuit of claim 8, further comprising:
    another memory cell; and
    another sense amplifier operably coupled to the other memory cell.

20. The electronic circuit of claim 19, further comprising:
    another transition detection circuit operably coupled to the other sense amplifier and to the control circuit, the control circuit configured to allow the reference current to be provided to both the sense amplifier and the other sense amplifier in response to the transition detection circuit having made a determination that the sense amplifier has identified a logic value stored in the memory cell and the other transition detection circuit having made a determination that the other sense amplifier has not identified a logic value stored in the other memory cell.

* * * * *